March 21, 1950 D. B. SMITH 2,501,416

MUTING CIRCUIT FOR FREQUENCY MODULATION RADIO RECEIVERS

Filed Feb. 28, 1945

Inventor:
David B. Smith
by his Attorneys
Howson & Howson

Patented Mar. 21, 1950

2,501,416

UNITED STATES PATENT OFFICE 2,501,416

MUTING CIRCUIT FOR FREQUENCY MODULATION RADIO RECEIVERS

David B. Smith, Flourtown, Pa., assignor, by mesne assignments, to Philco Corporation, Philadelphia, Pa., a corporation of Pennsylvania Application February 28, 1945, Serial No. 580,209

1 Claim. (Cl. 250—20)

This invention relates to frequency modulation receivers, and more particularly to receivers in which the frequency modulation detector includes, or is preceded by, an oscillator adapted to be synchronized with an applied frequency-modulated carrier wave. The general purpose of the invention is to facilitate and insure proper tuning of such a receiver, and consequently to improve its operation.

Frequency modulation receivers of the above-mentioned type are generally characterized by the existence of secondary tuning regions on either side of the correct tuning region. Correct tuning obtains when the aforementioned oscillator is exactly synchronized with the mean frequency of the incoming frequency-modulated carrier signal. When the receiver is incorrectly tuned within one of the secondary tuning regions, the oscillator is not synchronized with the incoming signal, and while the incoming signal may be received, the reception may be weak and subject to interference due to the incorrect tuning. There may also be present intermediate tuning regions between the correct tuning region and the secondary tuning regions, and when the receiver is tuned within one of the said intermediate regions, the oscillator may be synchronized with the incoming signal only part of the time, which gives rise to distortion. The existence of the secondary and intermediate tuning regions tends to render it difficult properly to tune a receiver of the type mentioned, especially since most users either do not realize that the incorrect tuning regions exist or they may find it difficult to distinguish between those regions and the correct tuning region.

The principal object of the present invention is to eliminate the above-mentioned objection by the provision of means for insuring the proper tuning of such a receiver by effectively eliminating the above-mentioned secondary and intermediate tuning regions so far as the user is concerned. This object is realized by utilizing to advantage a spurious supersonic signal which has been found to be present whenever the receiver is tuned within one of the secondary or intermediate tuning regions and the oscillator is not exactly synchronized with the incoming signal. The supersonic signal results from heterodyne or beating action between the oscillator signal and the applied signal, and it has a frequency equal to the difference between the frequencies of the two latter signals. In accordance with the present invention, this supersonic signal is utilized as a controlling agent to insure proper tuning of the receiver. This is accomplished by causing the supersonic signal to generate a control voltage, which in turn is utilized to mute the receiver until the supersonic signal disappears, at which time the oscillator is properly synchronized with the incoming signal. Thus the invention effectively eliminates the above-mentioned secondary and intermediate and tuning regions, as far as the user is concerned, since the receiver is silent whenever it is incorrectly tuned within one of those regions.

Reference may now be had to the accompanying drawing in which.

Figures 1, 2, 3:
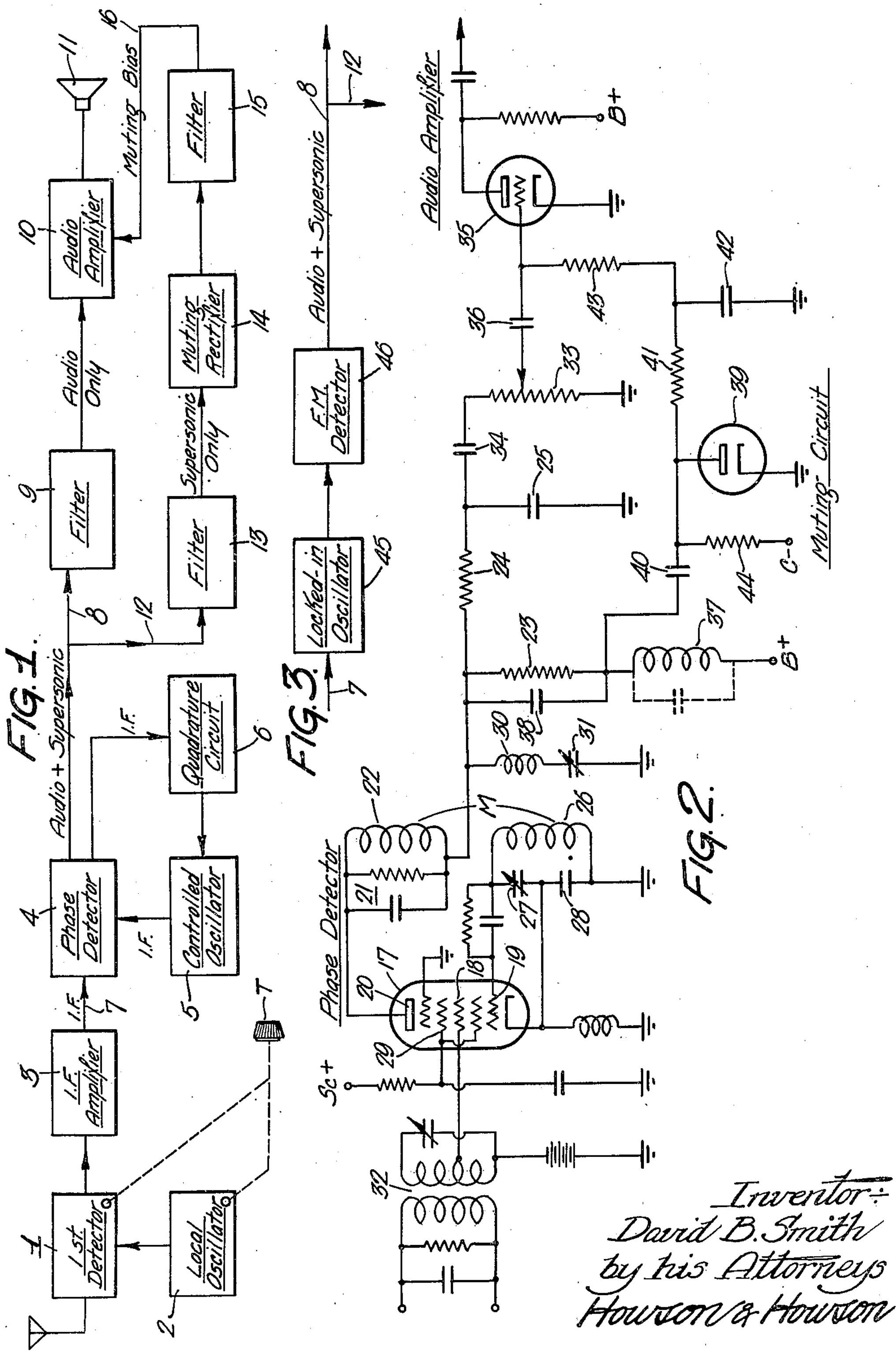
Fig. 1 is a simplified diagrammatic representation of a frequency modulation receiver embodying the present invention.
Fig. 2 is a schematic illustration of a preferred embodiment of the receiver.
Fig. 3 is a diagrammatic representation of a part of an alternative embodiment.

The invention will first be described, with reference to Figs. 1 and 2, as applied to a frequency modulation detector system of the character disclosed and claimed in a copending application of William E. Bradley, Serial No. 576,057, filed February 3, 1945, now Patent No. 2,494,795 issued January 17, 1950. In that system, the synchronized or locked-in oscillator is a part of the detector system. As indicated above, however, the invention is also applicable to frequency modulation receivers employing a conventional frequency modulation detector preceded by a locked-in oscillator serving as an amplitude limiter. Specific reference to the use of the present invention in combination with the latter type of system will be made in connection with Fig. 3, to be described hereinafter.

Referring first to Fig. 1 of the drawing, there is represented a frequency modulation receiver of the superheterodyne type comprising a first detector 1, a local oscillator 2, an intermediate frequency amplifier 3, and a suitable tuning means T for tuning the high frequency circuits of devices 1 and 2 to produce the desired intermediate frequency signal for transmission to the intermediate frequency amplifier 3. The foregoing elements are entirely conventional and form no part of the present invention, except insofar as the invention is adapted to provide an indication of the proper adjustment of the tuning means T. The frequency modulation detector comprises the phase detector 4, a controlled oscillator 5, and a quadrature circuit 6, these elements being interconnected as indicated. The frequency-modulated carrier signal (at intermediate frequency) is applied to the input of the phase detector 4 by way of the conductor 7. The detected audio frequency signal is derived from the phase detector 4 by way of conductor 8 and is supplied through a suitable low pass filter 9 to the audio amplifier 10 and thence to the sound-reproducing device or loudspeaker 11.

Since the present invention is not concerned with the details of operation of the frequency modulation detector, only brief reference need be made thereto. The oscillator 5 is initially adjusted so that when the intermediate-frequency carrier wave is unmodulated (i. e. is at its nominal center-frequency) the oscillation generated by the oscillator 5 is of like frequency but in phase quadrature with said carrier. As the frequency of the carrier varies in accordance with the intelligence frequency-modulated thereon, the oscillator frequency varies in substantial accordance therewith so that synchronism is maintained between the carrier and the oscillation generated by oscillator 5. However the phase angle between the latter oscillation and the frequency-deviated carrier varies in both directions from the initial quadrature relation as the said carrier deviates to either side of its nominal center frequency, the degree of departure depending upon the magnitude of the deviation of the carrier from its center frequency. The phase detector 4 functions to produce an audio output whose magnitude is proportional to the variation of the phase relation between the modulated carrier and the oscillator 5. The quadrature circuit 6 serves to control the oscillator. In the specific detector system shown, the quadrature circuit 6 is supplied with an I. F. control voltage from the phase detector 4, and in response to such voltage the quadrature circuit controls the frequency of the oscillator 5 in accordance with the frequency variation of the applied carrier.

For a more detailed description of the operation of the frequency modulation detector shown, reference may be had to the above-mentioned Bradley application. A different frequency modulation detector of the synchronized oscillator type is shown in U. S. Patent No. 2,332,540 issued to Charles Travis, October 26, 1943.

Referring still to Fig. 1, when the oscillator 5 is not properly synchronized with the incoming carrier signal, the output of the phase detector 4 includes the above-mentioned supersonic signal, as well as an audio component, as indicated in Fig. 1. As previously mentioned, this supersonic signal is utilized, according to the present invention, to mute the receiver unless the latter is tuned properly. Accordingly, the supersonic signal is derived by way of a connection 12 and is passed through a suitable filter 13 designed to pass such signal to a muting rectifier 14 which produces a control voltage. This voltage is passed through a filter 15 and is supplied to the audio amplifier 10 by way of the connection 16 so as to render the audio amplifier inoperative and thereby mute the receiver.

Reference may now be had to Fig. 2 of the drawing, which shows in detail a preferred embodiment of the frequency modulation receiver incorporating the present invention. In this figure, the multi-grid tube 17, which has input grids 18 and 19, serves both as a phase detector tube and as an oscillator tube. The phase detector comprises a portion of tube 17, a radio frequency output circuit comprising the anode 20 and the resonant plate circuit 21, and an audio frequency output circuit comprising the anode 20, the inductance coil 22, the audio frequency plate load resistor 23, and the R. F. filter combination 24—25.

The controlled oscillator comprises a tank circuit 26—27—28 and triode elements of the tube 17 including the input grid 19 and the screen grid 29, the latter serving as the oscillator anode.

The quadrature circuit comprises the resonant circuit 21 inductively coupled to the oscillator tank circuit. The low potential end of the resonant circuit 21 is returned to ground through a series resonant circuit 30—31, which is tuned to the intermediate frequency.

The received frequency-modulated carrier signal, preferably converted to an intermediate frequency, e. g. 4.2 mc., may be applied to the input grid 18 of tube 17 by means of a conventional tuned transformer 32. In operation, the detector produces an audio output in the manner hereinbefore indicated.

As thus far described, the circuit of Fig. 2 forms the subject of the above-mentioned Bradley application. As illustrated, the audio output from the phase detector may be supplied to a volume control device 33 by way of the coupling condenser 34, and thence to an audio amplifier tube 35 through the coupling condenser 36.

In accordance with the present invention, there is provided a muting circuit as indicated, the purpose and general operation of which have already been described. In series with the audio frequency load resistor 23 is a load inductance 37 which is self-resonant (by virtue of its distributed capacity) to a broad band of supersonic frequencies, e. g. 100 to 150 k. c. A suitable by-pass condenser 38 is connected in shunt with the audio load resistor 23 and serves to by-pass the supersonic frequencies about the audio load resistor and to supply them, without substantial attenuation, to the supersonic load impedance 37. The voltage across the inductance coil 37 is supplied to a rectifier diode 39 through the coupling condenser 40. The rectified voltage is supplied by way of a low-pass filter 41, 42 and grid leak 43 to the control grid of the amplifier tube 33. The latter is provided with a normal bias through the resistors 44, 41 and 43.

Considering the operation of the circuit, when the receiver is correctly tuned so that the oscillator of the frequency modulation detector is exactly synchronized with the incoming carrier signal, the supersonic signal is not present in the output of the detector and, therefore, there is no voltage of supersonic frequency across the inductance 37. Consequently, the rectifier 39 is inoperative, and the audio amplifier tube 33 operates with its normal bias. During tuning of the receiver, when the receiver is tuned within the secondary or intermediate tuning regions hereinbefore mentioned, a supersonic signal appears in the output of the detector due to the beating of the received signal with the unsynchronized oscillator signal. Consequently, a voltage of supersonic frequency appears across the inductance 37, is rectified by the diode 39, and supplied, as a muting bias voltage, to the grid of the audio amplifier 33, which voltage is added to the normal bias of the amplifier tube. The audio amplifier tube 33 is thus biased below plate current cut-off, so that the receiver is muted as long as the supersonic signal is present. When the correct tuning region is reached, the oscillator is exactly synchronized with the incoming signal, the supersonic signal disappears, and the muting bias is removed from the audio amplifier tube 33. The result of this operation is that the user does not hear the desired signal until the receiver is correctly tuned. In other words, so far as the user is concerned, there is only one relatively narrow tuning region and that is the correct one.

It is important to note that the muting means provided by the invention does not interfere with the tuning of the receiver to any desired carrier signal through the tuning range. The supersonic signal is present only in the incorrect tuning region on each side of the correct tuning position for each signal within the tuning range. Therefore, the receiver is muted only in the incorrect tuning regions.

In one physical embodiment of the muting circuit employed in association with the other circuits shown, the inductance coil 37 had a value of 10 millihenries and had sufficient distributed capacity so as to be self-resonant to a band of supersonic frequencies extending from approximately 100 kc. to 150 kc. The supersonic by-pass condenser 38 had a value of 500 micro-microfarads.

The embodiments of Figs. 1 and 2 are illustrative of receivers in which the frequency modulation detector includes an oscillator adapted to be synchronized with an applied frequency-modulated carrier signal. Fig. 3 is illustrative of a receiver in which a conventional frequency modulation detector is preceded by a locked-in oscillator serving as an amplitude limiter. The locked-in oscillator 45 and the frequency modulation detector (discriminator) 46, of Fig. 3, may be substituted directly for the elements 4, 5 and 6 of Fig. 1 in a manner which will be evident from an inspection of Figs. 1 and 3. Where the locked-in oscillator 45 is constructed and arranged to operate at the fifth subharmonic of the signal applied at 7, the supersonic beat frequency referred to above results from the beating of the signal applied at 7 with the fifth harmonic of the oscillator 45. Such supersonic beat frequencies occur whenever the receiver is so improperly tuned as to preclude proper lock-in between the oscillator 45 and the applied signal. The construction and mode of operation of frequency modulation receivers comprising a frequency discriminator preceded by a locked-in oscillator functioning as an amplitude limiter is well known to those skilled in the art. A specific embodiment of such an arrangement, which may be referred to by way of illustration, is illustrated and described in the G. L. Beers Patent No. 2,356,201, issued August 22, 1944.

While the invention has been illustrated and described with reference to a number of specific embodiments, it will be apparent to those skilled in the art that it is capable of various other embodiments and modifications without departing from its scope as defined in the appended claim.

In the appended claim, where reference is made to a synchronized or locked-in oscillator, it is to be understood that synchronization is contemplated either at the fundamental, or at a subharmonic, of the applied frequency.

I claim:

In a frequency modulation receiver: a source of frequency modulated carrier waves; a frequency modulation detector arranged to derive, from said carrier waves, audio-frequency signal components corresponding to the modulation of said waves whenever said receiver is tuned, said detector comprising an oscillator normally tuned to the center frequency of said carrier waves, a phase detector, means for simultaneously applying to said phase detector said carrier waves and signals derived from said oscillator, said phase detector being adapted to sense the phase difference therebetween and to generate a control signal corresponding to said phase difference, control means responsive to said control signal for synchronizing said oscillator signals with said carrier waves in quadrature phase relation, synchronism between said oscillator signals and said carrier waves corresponding to the tuned condition of said receiver, said frequency modulation detector being further adapted to generate supersonic signal components whenever said receiver is mistuned, the mistuned condition of said receiver corresponding to the unsynchronized condition of said oscillator; an audio-frequency circuit coupled to said frequency modulation detector to receive said audio-frequency signal components; branch circuit means connected between the output of said frequency modulation detector and said audio-frequency circuit, said branch circuit means being arranged to separate said supersonic signal components from the output of said frequency modulation detector; means responsive to said separated supersonic signal components to generate a bias potential; and means for applying said potential to cut off said audio-frequency circuit, thereby disabling said receiver whenever said receiver is mistuned.

DAVID B. SMITH.

REFERENCES CITED

The following references are of record in the file of this patent:

UNITED STATES PATENTS

| Number | Name | Date |
|---|---|---|
| 2,035,176 | McLennan | Mar. 24, 1936 |
| 2,063,588 | Crosby | Dec. 8, 1936 |
| 2,096,874 | Beers | Oct. 26, 1937 |
| 2,112,595 | Farnham | Mar. 29, 1938 |
| 2,115,813 | Jarvis | May 3, 1938 |
| 2,147,595 | Hilferty | Feb. 14, 1939 |
| 2,160,566 | Schmidt | May 30, 1939 |
| 2,224,224 | Hallam, Jr. | Dec. 10, 1940 |
| 2,241,569 | Zakarias | May 13, 1941 |
| 2,263,633 | Koch | Nov. 25, 1941 |
| 2,279,095 | Sohnemann | Apr. 7, 1942 |
| 2,296,056 | Roberts | Sept. 15, 1942 |
| 2,301,649 | Thompson | Nov. 10, 1942 |
| 2,356,201 | Beers | Aug. 22, 1944 |
| 2,379,721 | Koch | July 3, 1945 |